United States Patent
Ishizuki et al.

(10) Patent No.: US 11,967,932 B2
(45) Date of Patent: Apr. 23, 2024

(54) CRYSTAL ELEMENT, METHOD FOR MANUFACTURING SAME, AND OPTICAL OSCILLATION DEVICE INCLUDING CRYSTAL ELEMENT

(71) Applicant: INTER-UNIVERSITY RESEARCH INSTITUTE CORPORATION NATIONAL INSTITUTES OF NATURAL SCIENCES, Mitaka (JP)

(72) Inventors: Hideki Ishizuki, Okazaki (JP); Takunori Taira, Okazaki (JP)

(73) Assignee: INTER-UNIVERSITY RESEARCH INSTITUTE CORPORATION NATIONAL INSTITUTES OF NATURAL SCIENCES, Mitaka (JP)

( * ) Notice: Subject to any disclaimer, the term of this patent is extended or adjusted under 35 U.S.C. 154(b) by 0 days.

(21) Appl. No.: 17/638,229

(22) PCT Filed: Jul. 20, 2020

(86) PCT No.: PCT/JP2020/028164
§ 371 (c)(1),
(2) Date: Feb. 25, 2022

(87) PCT Pub. No.: WO2021/044752
PCT Pub. Date: Mar. 11, 2021

(65) Prior Publication Data
US 2022/0329205 A1    Oct. 13, 2022

(30) Foreign Application Priority Data
Sep. 3, 2019 (JP) ................................ 2019-160502

(51) Int. Cl.
*H03B 5/32* (2006.01)
*H03H 3/02* (2006.01)

(52) U.S. Cl.
CPC ................ *H03B 5/32* (2013.01); *H03H 3/02* (2013.01)

(58) Field of Classification Search
CPC .......... H03B 5/32; H03H 3/02; G02F 1/3558; G02F 1/37
See application file for complete search history.

(56) References Cited

U.S. PATENT DOCUMENTS

2005/0225215 A1* 10/2005 Kurimura ............... C30B 33/00
                                                        310/348
2008/0046043 A1    2/2008 Kurimura et al.

FOREIGN PATENT DOCUMENTS

| JP | H11-212128 A | 8/1999 |
| JP | 2004-107187 A | 4/2004 |

(Continued)

OTHER PUBLICATIONS

Translation of JP2012150165 (Year: 2012).*

(Continued)

*Primary Examiner* — Jeffrey M Shin
(74) *Attorney, Agent, or Firm* — Faegre Drinker Biddle & Reath LLP (57) ABSTRACT

A crystal quartz element includes a main face provided with a plurality of polarity inverted regions and a polarity non-inverted region, the plurality of polarity inverted regions are spaced apart from each other via the polarity non-inverted region, and the main face is a plane face. A method for manufacturing a crystal quartz element includes: preparing a crystal quartz body including a first main face which is a plane face, and a first pressing jig including a first pressing face on which a plurality of first projections are provided; and forming a plurality of polarity inverted regions corre- (Continued)

sponding to the plurality of first projections in the crystal quartz body by heating and pressing the first main face by the first pressing face.

15 Claims, 8 Drawing Sheets

(56) References Cited

FOREIGN PATENT DOCUMENTS

| | | |
|---|---|---|
| JP | 2004-239959 A | 8/2004 |
| JP | 2004-279612 A | 10/2004 |
| JP | 4666449 B2 | 4/2011 |
| JP | 2012-150165 A | 8/2012 |
| JP | 2018-155935 A | 10/2018 |

OTHER PUBLICATIONS

International Preliminary Report on Patentability dated Mar. 17, 2022 for PCT/JP2020/028164.
Adachi, Muneyuki et al., "Deep ultraviolet light generation at 266 nm by quasi-phase-matched quartz," 2007 Conference on Lasers and Electro-Optics (CLEO), Jun. 5, 2007.
Extended European Search Report dated Aug. 14, 2023 in Application No. 20859939.9.

* cited by examiner

CRYSTAL ELEMENT, METHOD FOR MANUFACTURING SAME, AND OPTICAL OSCILLATION DEVICE INCLUDING CRYSTAL ELEMENT

TECHNICAL FIELD

The present disclosure relates to a crystal quartz element, a method of manufacturing the same, and an optical oscillation device including the crystal quartz element.

BACKGROUND ART

Crystal quartz has been conventionally known as a material for piezoelectric elements such as oscillators and vibrators. In addition, crystal quartz is an optical material having low absorptivity, transparency, and durability with respect to laser light, and is known as a nonlinear optical crystal used for the first wavelength conversion in the world. As an optical element made of such crystal quartz, there is an element in which a periodic inversion structure of a nonlinear optical constant necessary for quasi-phase matching (QPM) is provided. For example, Patent Document 1 discloses a quasi-phase matching wavelength conversion element using a crystal quartz substrate including a periodic step structure. Patent Document 1 discloses that the crystal quartz substrate is pressed by a pair of heater blocks to provide the crystal quartz substrate with a polarity inverted region reflecting the step structure.

CITATION LIST

Patent Literature

[Patent Document 1] Japanese Patent No. 4,666,449

SUMMARY OF INVENTION

Technical Problem

In the method disclosed in Patent Document 1, it is necessary to perform processing for forming the stepped structure on the surface of the crystal quartz, and there is a problem in mass productivity.

An object of one aspect of the present disclosure is to provide a crystal quartz element capable of improving mass productivity, a method of manufacturing the same, and an optical oscillation device including the crystal quartz element.

Solution to Problem

A crystal quartz element according to one aspect of the present disclosure is a crystal quartz element including a main face provided with a plurality of polarity inverted regions and a polarity non-inverted region, wherein the plurality of polarity inverted regions are spaced apart from each other via the polarity non-inverted region, and the main face is a plane face.

The crystal quartz element has a main face provided with a plurality of polarity inverted regions, and the main face is a plane face. Thus, the plurality of polarity inverted regions may be provided in the main face of the crystal quartz element without forming a stepped structure. Therefore, since it is not necessary to perform processing for forming a step or the like on a surface of the crystal quartz, the mass productivity of the crystal quartz element can be improved.

A thickness of the crystal quartz element along a second direction crossing the main face may be greater than or equal to 0.1 µm, and a depth of each of the plurality of polarity inverted regions along the second direction may be greater than or equal to 5 µm. In this case, light transmitted through the inside of the crystal quartz element is well phase-matched in the plurality of polarity inverted regions.

A depth of each of the plurality of polarity inverted regions along the second direction may be greater than or equal to 100 µm. In this case, the light transmitted inside the crystal quartz element is better phase-matched in the polarity inverted regions.

The plurality of polarity inverted regions may be arranged in a predetermined position derived from the refractive index dispersion of a crystal quartz. In this case, the intended performance of the crystal quartz element can be favorably exhibited.

An optical oscillation device according to another aspect of the present disclosure includes the crystal quartz element and a laser light generation device configured to emit laser light to the crystal quartz element, wherein an intensity of the laser light is higher than a damage threshold light intensity of lithium niobate. In this case, unlike the case where lithium niobate is used as the optical element, for example, damage to the optical element can be prevented.

A method of manufacturing a crystal quartz element according to still another aspect of the present disclosure includes preparing a crystal quartz body including a first main face which is a plane face, and a first pressing jig including a first pressing face on which a plurality of first projections are provided, and forming a plurality of polarity inverted regions corresponding to the plurality of first projections in the crystal quartz body by heating and pressing the first main face by the first pressing face.

In the method of manufacturing the crystal quartz element, a plurality of polarity inverted regions corresponding to a plurality of first projection are formed in a crystal quartz body by using a first pressing jig in which the plurality of first projections are provided. As a result, it is possible to form a plurality of polarity inverted regions from a side of the first main face of the crystal quartz body without performing the concavo-convex processing on the first main face. Further, by reusing the first pressing jig, a plurality of crystal quartz elements can be manufactured with high efficiency and good reproducibility. Therefore, the mass productivity of the crystal quartz element can be improved by carrying out the manufacturing method.

The crystal quartz body may include a second main face located opposite to the first main face, in the preparing the crystal quartz body and the first pressing jig, a second pressing jig including a second pressing face on which a plurality of second projections are provided is further prepared, and, when the first pressing face heats and presses the first main face, the second projection face heats and presses the second main face in a state in which the first projections and the second projections faces with each other through the crystal quartz body. In this case, the ratio of the depth to the width of each polarity inverted region can be increased. Thus, the light transmitted through the crystal quartz element is well phase-matched in the plurality of polarity inverted regions.

When the first pressing face heats and presses the first main face, the temperature of the first pressing jig may be set to 200° C. or more and 573° C. or less, and a force equal to or greater than 100 MPa and directed toward the crystal quartz body may be applied to the first pressing jig. In this case, the ratio of the depth to the width of each polarity inverted region can be increased. Thus, the light transmitted through the crystal quartz element is well phase-matched in the plurality of polarity inverted regions.

A difference between a linear thermal expansion coefficient of the first pressing jig and the linear thermal expansion coefficient of the crystal quartz may be 113% or less. In this case, when the first pressing face heats and presses the first main face, damage to at least one of the crystal quartz body and the first pressing jig can be prevented.

A hardness of the first projections may be greater than or equal to a hardness of a crystal quartz. In this case, since the first projection is less likely to be worn by the crystal quartz body, the first pressing jig can be favorably reused.

Advantageous Effects of Invention

According to one aspect of the present disclosure, it is possible to provide a crystal quartz element capable of improving mass productivity, a method of manufacturing the same, and an optical oscillation device including the crystal quartz element.

BRIEF DESCRIPTION OF DRAWINGS (a) of FIG. 1 is a plan view illustrating a crystal quartz element according to an embodiment, and (b) if FIG. 1 is a side view illustrating the crystal quartz element according to the present embodiment.

(a) and (b) of FIG. 3 are views illustrating a method of manufacturing a crystal quartz element according to an embodiment.

(a) and (b) of FIG. 6 are schematic views showing another example of the crystal quartz element.

DESCRIPTION OF EMBODIMENTS

Hereinafter, an embodiment according to one aspect of the present disclosure will be described in detail with reference to the accompanying drawings. In the following description, the same elements or elements having the same functions are denoted by the same reference numerals, and redundant description will be omitted. It should be noted that "the same" and words similar thereto in the present specification are not limited to "completely the same".

Figure 1:
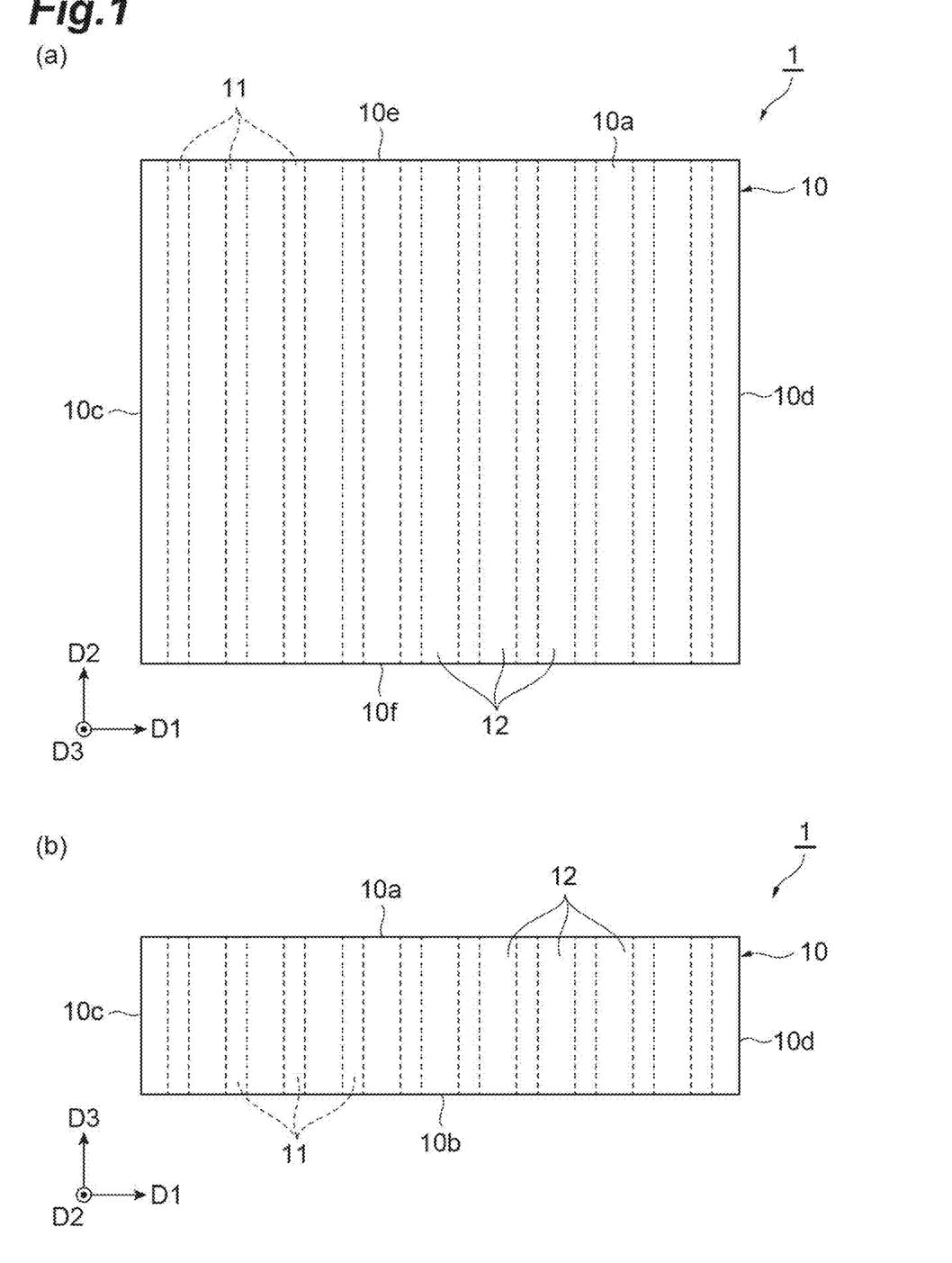

(a) of FIG. 1 is a plan view illustrating a crystal quartz element according to a present embodiment. (b) of FIG. 1 is a side view illustrating a crystal quartz element according to the present embodiment. The crystal quartz element 1 shown in (a) and (b) of FIG. 1 is an element made of crystal quartz ($SiO_2$). The crystal quartz element 1 may be, for example, an optical element functioning as an optical waveguide, a wavelength conversion element, or the like, or may be a piezoelectric element functioning as an oscillator, a vibrator, or the like. In the present embodiment, the crystal quartz element 1 functions as a wavelength conversion element.

For example, when fundamental wave light is incident on the crystal quartz element 1, light obtained by converting the fundamental wave light (wavelength-converted light) is emitted from the crystal quartz element 1. The wavelength-converted light is, for example, light of a higher order than the fundamental wave light. For example, when laser light having a wave length of 1064 nm is incident on the crystal quartz element 1, the wave length of the laser light emitted from the crystal quartz element 1 is 532 nm. The crystal quartz has high transmissivity with respect to deep ultraviolet rays (for example, about 150 nm).

In addition, the crystal quartz element 1 formed of the crystal quartz may be hardly broken even when laser light having an intensity of several 100 $GW/cm^2$ or more is irradiated. Therefore, the crystal quartz element 1 according to the present embodiment is preferably used as an optical element for light having an intensity equal to or higher than that of light that can be utilized by, for example, lithium niobate ($LiNbO_3$), which is a kind of nonlinear optical crystal. The intensity of light available to lithium niobate is a light intensity (hereinafter referred to as "damage threshold light intensity $I_{DT, LN}$") derived from a laser damage threshold (DT) of lithium niobate. For example, the damage threshold light intensity $I_{DT, PPLN}$ for pulse width 10 ns of periodically poled magnesium-added lithium niobate (PPMgLN or PPLN) subjected to polarity inversion is 300 $MW/cm^2$. In general, the damage threshold light intensity is inversely proportional to the square root of the pulse width. Thus, the damage threshold light intensity $I_{DT, LN}$ of lithium niobate for any pulse width τ (ns) corresponds to $300 \times (10/\tau)^{1/2}$ $MW/cm^2$. Therefore, for example, when the intensity of light oscillated from the laser light generation device is $300 \times (10/\tau)^{1/2}$ $MW/cm^2$ or more, it is preferable to use the crystal quartz element 1 from the viewpoint of preventing damage to the optical element. In other words, when the intensity of the light incident on the optical element is higher than the damage threshold light intensity of lithium niobate, it is preferable to use the crystal quartz element 1 as the optical element.

Referring to (a) and (b) of FIG. 1, the crystal quartz element 1 according to the present embodiment includes a sheet of crystal quartz body 10 having a plate shape. The crystal quartz body 10 has a pair of main face 10a and 10b, and side face 10c to 10f connecting the main face 10a and 10b. Each of the main face 10a (first main face), the main face 10b (second main face), and the side face 10c to 10f is a plane face and has a substantially rectangular shape. The side face 10c is a light incident face in the crystal quartz element 1, and the side face 10d is a light emitting face in the crystal quartz element 1. In the following description, a direction orthogonal to the side faces 10c, 10d is referred to as a direction D1 (first direction), a direction orthogonal to the side faces 10e, 10f is referred to as a direction D2 (second direction), and a direction orthogonal to the main face 10a, 10b is referred to as a direction D3 (third direction). The direction D3 corresponds to a depth direction of the crystal quartz body 10. In the following description, side viewing corresponds to viewing from the direction D1 or the direction D2, and plan viewing corresponds to viewing from the direction D2.

The dimension of the crystal quartz body 10 along the direction D1 is, for example, equal to or longer than 0.1 mm and equal to or shorter than 40 mm, and the dimension of the crystal quartz body 10 along the direction D2 is, for example, equal to or longer than 0.1 mm and equal to or shorter than 10 mm. The dimension of the crystal quartz body 10 along the direction D3 (i.e., the depth of the crystal quartz element 1) is, for example, equal to or longer than 0.1 µm and equal to or shorter than the 10 mm. The lower limit of the crystal quartz element 1 may be 5 µm, 10 µm, 100 µm, or 1 mm. Therefore, the crystal quartz element 1 may be 5 µm or more and 10 mm or less, 10 µm or more and 10 mm or less, 100 µm or more and 10 mm or less, or 1 mm or more and 10 mm or less.

The crystal quartz body 10 is provided with a plurality of polarity inverted regions 11 and a plurality of polarity non-inverted regions 12. Each polarity inverted region 11 is a region generated by heating and stressing the crystal quartz, and is provided at least in the main face 10a. A polarity axis of the polarity inverted region 11 and a polarity axis of the polarity non-inverted region 12 are inverted by, for example, 180° with respect to each other. A method of forming the polarity inverted region 11 will be described later. In the present embodiment, each polarity inverted region 11 is provided from the side face 10e to the side face 10f in the direction D2, and is provided from the main face 10a to the main face 10b in the direction D3. In this case, the polarity inverted region 11 and the polarity non-inverted region 12 are alternately arranged in the direction D1. Also, the dimension in each polarity inverted region 11 along the direction D2 corresponds to the dimension of the crystal quartz body 10 along the direction D 2. The depth in each polarity inverted region 11 along the direction D3 corresponds to the thickness of the crystal quartz body 10. Therefore, in the present embodiment, the light incident from the side face 10c of the crystal quartz element 1 and emitted from the side face 10d of the crystal quartz element 1 is transmitted through all of the plurality of polarity inverted regions 11.

The plurality of polarity inverted regions 11 are spaced apart from each other via the polarity non-inverted region 12. That is, the polarity non-inverted region 12 is located between the adjacent polarity inverted regions 11. The plurality of polarity inverted regions 11 are arranged in a predetermined position derived from the refractive index dispersion of crystal quartz, in the crystal quartz body 10. In the present embodiment, the plurality of polarity inverted regions 11 are periodically arranged in the direction D1. When the crystal quartz element 1 is an optical element, the predetermined position $\Lambda$ can be derived by, for example, an equation "$\Lambda=(\lambda/2)/(N^{2w}-N^{w})$". $\lambda$ is the wave length of the fundamental wave light, $N^{w}$ is the refraction index of the input light, and $N^{2w}$ is the refraction index of the wavelength-converted light. By using the above equation, the predetermined position is appropriately adjusted in accordance with changes in the wavelength of light and the refractive index. For example, in the present embodiment, the dimension of the polarity inverted region 11 in the direction D1 (the width of the polarity inverted region 11) and the interval between the adjacent polarity inverted regions 11 in the direction D1 (that is, the width of the polarity non-inverted region 12 in the direction D1) change in accordance with the wavelength of light transmitted through the crystal quartz element 1.

Each of the plurality of polarity non-inverted regions 12 is a region other than the polarity inverted region 11 in the crystal quartz body 10. That is, each polarity non-inverted region 12 is at least a region to which stress is not applied in the crystal quartz body 10.

In the present specification, the cycle of the quasi phase match (QPM pitch) corresponds to the sum of the widths of one polarity inverted region 11 and one polarity non-inverted region 12 adjacent to each other in the direction D1.

Figure 2:
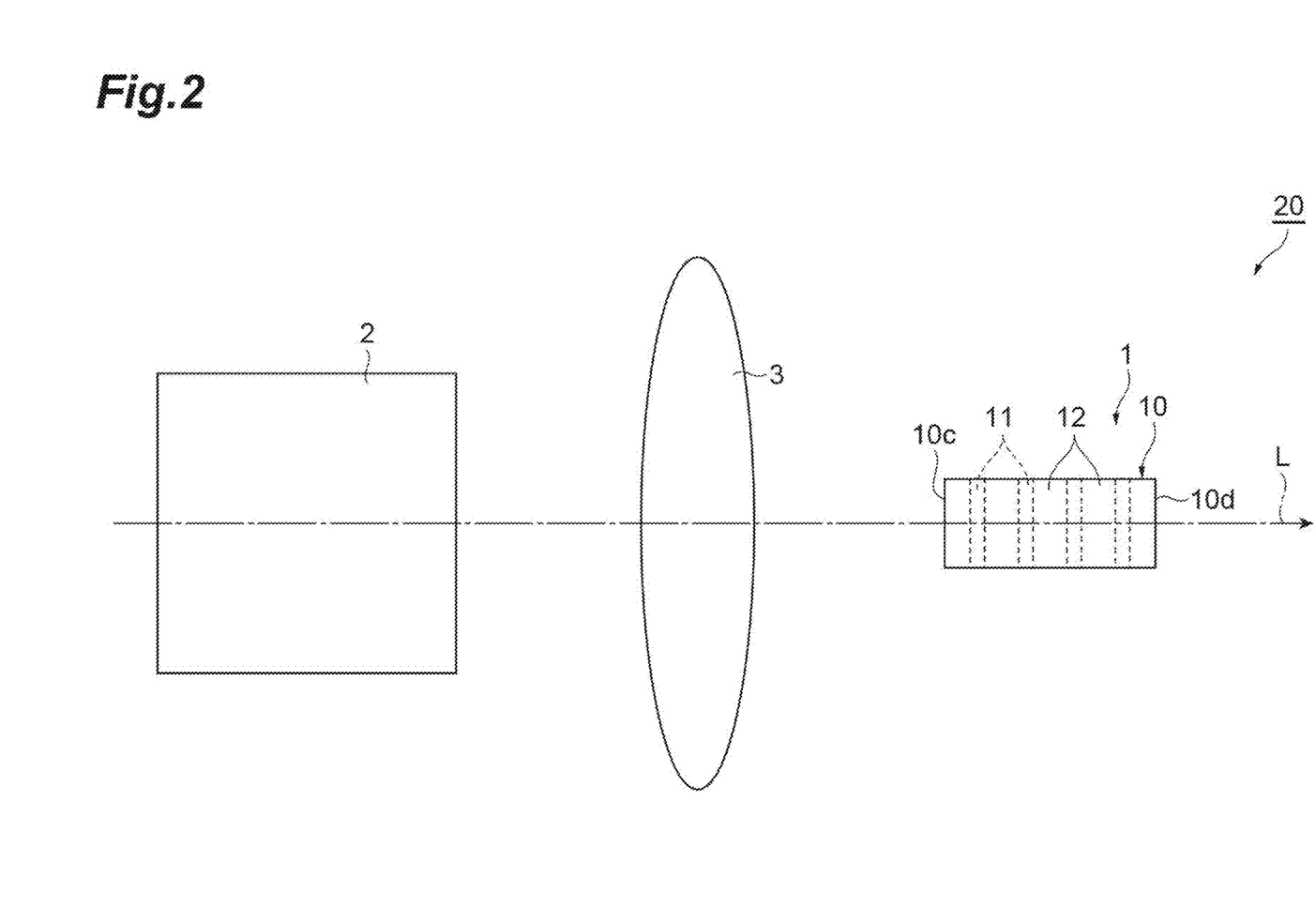
FIG. 2 is a schematic view illustrating a configuration of an optical oscillation device using a crystal quartz element according to an embodiment.

FIG. 2 is a schematic diagram showing a configuration of an optical oscillation device using the crystal quartz element 1 according to the present embodiment. As shown in FIG. 2, the optical oscillation device 20 includes a pulsed light generating device 2 and a condenser lens 3 in addition to the crystal quartz element 1. In the optical oscillation device 20, the pulsed light generating device 2, the condenser lens 3, and the crystal quartz element 1 are sequentially disposed. The optical oscillation device 20 may additionally include an optical element such as a mirror, a lens, or a photodiode.

The pulsed light generating device 2 is a laser light generation device that oscillates pulsed laser light L, and is, for example, a microchip laser light generation device. The laser light L is close to a Gaussian beam, for example. The pulse width of the laser light L is, for example, equal to or greater than 10 ps and equal to or less than 1 ns, and the energy per one pulse of the laser light L is equal to or greater than 2 mJ. Therefore, the intensity of the laser light L incident on the crystal quartz element 1 is equal to or greater than the damage threshold light intensity of lithium niobate, for example, equal to or greater than 50 GW/cm². The pulsed light generating device 2 includes, for example, a semiconductor laser device, a light emitting crystal (laser medium) made of Nd:YVO$_4$ or Nd:YAG, and a passive Q switch made of Cr:YAG. In this case, semiconductor laser light generated from the semiconductor laser device excites the light-emitting crystal. Then, the laser light having reached a predetermined intensity is transmitted through the passive Q switch, whereby laser light L is emitted from the pulsed light generating device 2.

The condenser lens 3 is an optical element for condensing the laser light L to a side face 10c of the crystal quartz element 1. The minimum beam waist of the laser light L obtained by condensing by the condenser lens 3 is likely to be very small. Since the pulse width of the laser light L is short and the minimum beam waist thereof is small, the intensity per unit area of the laser light L in the side face 10c of the crystal quartz element 1 may be equal to or greater than 50 GW/cm².

Next, a method of manufacturing the crystal quartz element 1 according to the present embodiment will be described with reference to (a) and (b) of FIG. 3, and FIG. 4. (a) and (b) of FIG. 3, and FIG. 4 illustrate a method of manufacturing the crystal quartz element 1 according to the present embodiment.

Figure 3:
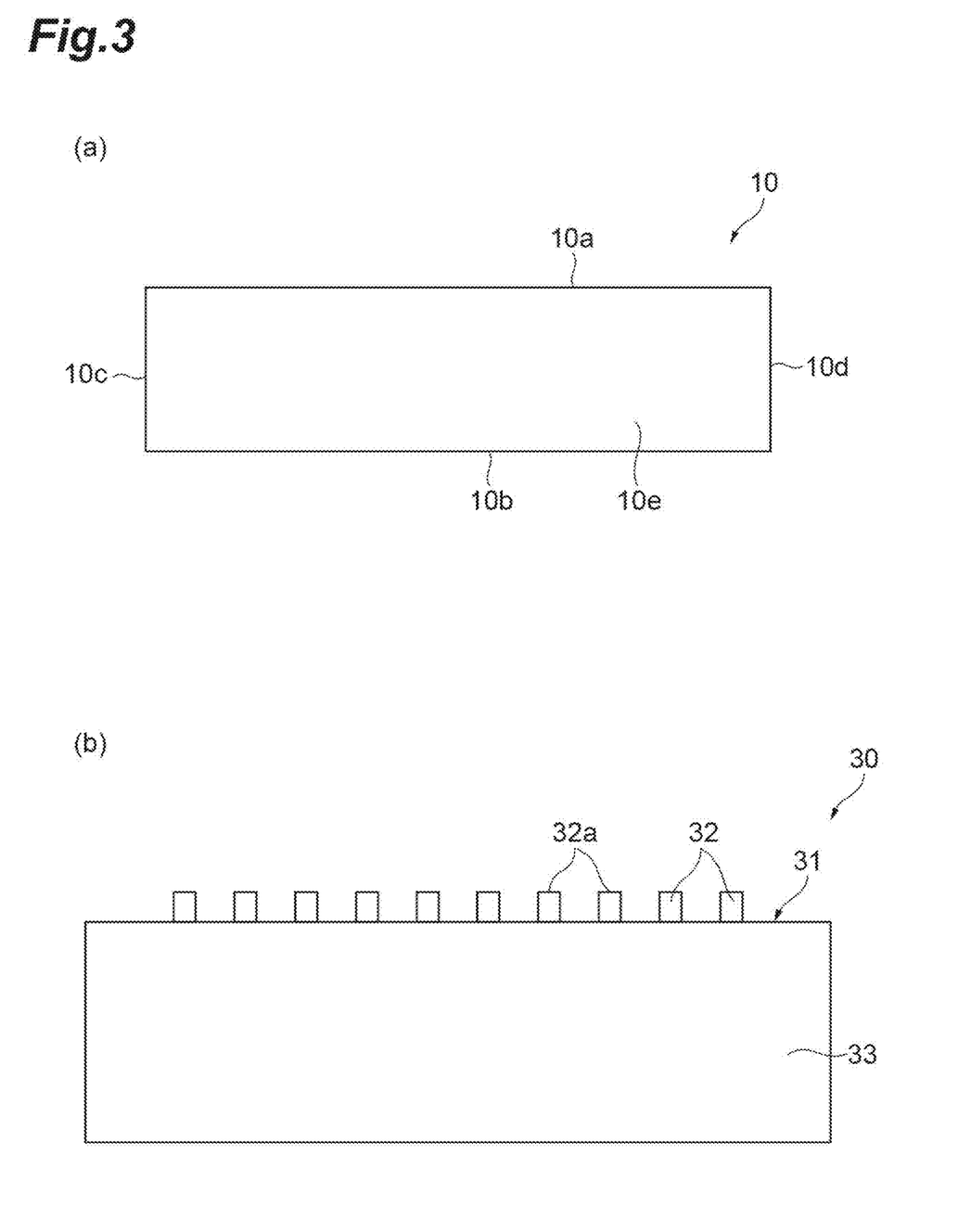

First, as shown in (a) of FIG. 3, a crystal quartz body 10 having main faces 10a and 10b, which are plane faces, is prepared (preparation step). In addition, as shown in (b) of FIG. 3, a pressing jig 30 (first pressing jig) having a pressing face 31 (first pressing face) is prepared. The preparation of the crystal quartz body 10 and the preparation of the pressing jig 30 may be performed at the same time or at different timings.

The pressing jig 30 is a stamp (QPM stamp) for pressing the crystal quartz body 10 with its pressing face 31, and has a main body 33 including the pressing face 31 on which a plurality of projections 32 (a plurality of first projections) are provided. To this end, the pressing face 31 of the pressing jig 30 includes an uneven surface. Each of the plurality of projections 32 is a protrusion protruding from the main body portion 33, and has a substantially rectangular shape in plan view and side view. The plurality of projections 32 are formed by performing cutting processing, etching processing, or the like on the main body portion 33, for example. In the present embodiment, the plurality of projections 32 are provided periodically. The distal face 32a of each projection 32 is a plane face located on the same plane face in side view. The amount of protrusion of each projection 32 is, for example, equal to or greater than 0.1 µm and equal to or less than 100 µm. The width of each projection 32 and the interval between adjacent projections 32 are appropriately adjusted in accordance with the performance required for the crystal quartz element 1. The dimension of each projection 32 along the direction intersecting the projection direction and the widthwise direction may be substantially the same as the dimension of the crystal quartz body 10 along the direction D2. From the viewpoint of preventing damage to the pressing jig 30, a hardness of the projection 32 is equal to or higher than a hardness of the crystal quartz. The pressing jig 30 is, for example, a jig made of metal, an alloy such as stainless steel, or ceramics. The pitch of each projection 32 substantially corresponds to the QPM pitch of the crystal quartz element 1.

Figure 4:
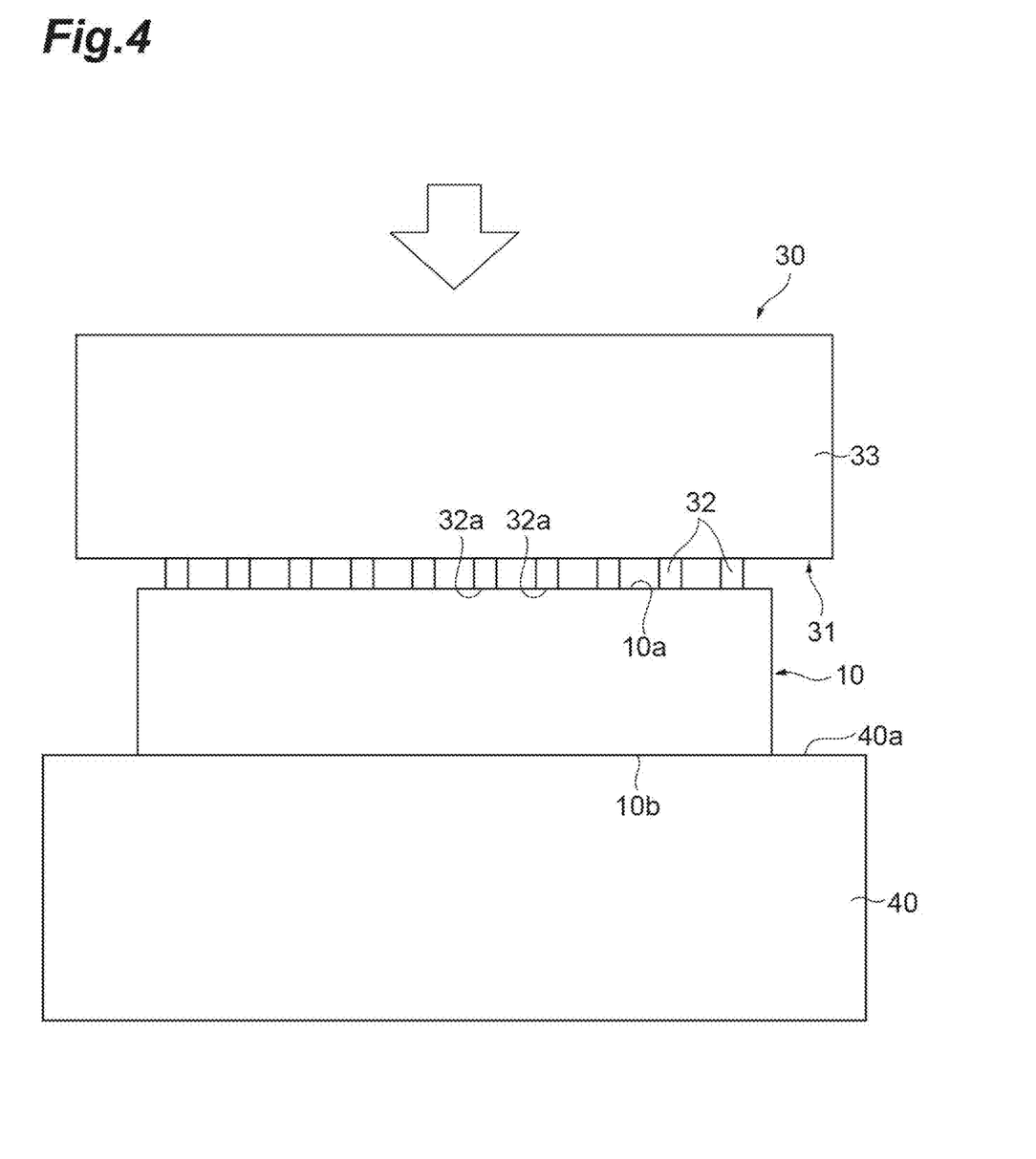
FIG. 4 is a view illustrating a method of manufacturing a crystal quartz element according to an embodiment.

Next, as shown in FIG. 4, the pressing face 31 heats and presses the main face 10a of the crystal quartz body 10 to form a plurality of polarity inverted regions 11 corresponding to the plurality of projections 32 on the crystal quartz body 10 (polarity inverted region forming process). In this step, first, the crystal quartz body 10 is placed on a flat placement surface 40a of a stage 40. At this time, the crystal quartz body 10 is fixed to the stage 40. Next, the pressing face 31 of the preheated pressing jig 30 is brought into contact with the main face 10a of the preheated crystal quartz body 10. In this case, the pressing jig 30 and the crystal quartz body 10 are heated, for example, by heating an inside of a chamber accommodating the pressing jig and the crystal quartz body. Then, a stress toward the crystal quartz body 10 is applied to the pressing jig 30. As described above, the crystal quartz element 1 (see (a) and (b) of FIG. 1) in which the plurality of polarity inverted regions 11 corresponding to the plurality of projections 32 are provided is manufactured by the QPM stamp method using the QPM stamp. The force acting on the pressing jig 30 toward the crystal quartz body 10 is, for example, equal to or greater than 100 MPa. In this case, the ratio of the depth to the width of each polarity inverted region 11 can be increased.

When the pressing face 31 of the pressing jig 30 heats and presses the main face 10a of the crystal quartz body 10, the pressing jig 30 and the crystal quartz body 10 are preheated to, for example, 200° C. or more and 573° C. or less. When the pressing jig 30 and the crystal quartz body 10 are heated to 200° C. or more, the polarity inverted region 11 is easily formed in the crystal quartz body 10. Since the pressing jig 30 and the crystal quartz body 10 are heated to 573° C. or less, an unintended phase transition of the crystal quartz body 10 may be prevented. Further, from the viewpoint of preventing damage to at least one of the crystal quartz body 10 and the pressing jig 30, the difference between a linear expansion coefficient of the pressing jig 30 and a linear expansion coefficient of the crystal quartz is 113% or less. When the difference has a lower limit, the lower limit may be 0% or may be 27%. In a case where the difference is 113% or less, mechanical damage in both the pressing jig 30 and the crystal quartz body 10 is suppressed when stress is applied to the crystal quartz body 10 or the like. Assuming that the linear thermal expansion coefficient of the pressing jig 30 is LEC1 and the linear thermal expansion coefficient of the crystal quartz is LEC2, the difference between the linear thermal expansion coefficient of the pressing jig 30 and the linear thermal expansion coefficient of the crystal quartz is expressed by "(LEC1−LEC2)/LEC2."

The crystal quartz element 1 manufactured by the manufacturing method according to the present embodiment described above has a main face 10a in which a plurality of polarity inverted regions 11 are provided, and the main face 10a is a plane face. In addition, in the present embodiment, a plurality of polarity inverted regions 11 are formed in the crystal quartz body 10 using a pressing jig 30 having a plurality of projections 32. Therefore, it is possible to form the plurality of polarity inverted regions 11 from a side of the main face 10a without performing the concavo-convex processing on the main face 10a of the crystal quartz element 1. In other words, it is not necessary to perform processing for forming a step or the like on the surface of the crystal quartz body 10. In addition, by reusing the pressing jig 30, a plurality of crystal quartz elements 1 can be manufactured with high efficiency and good reproducibility. Therefore, according to this embodiment, the mass productivity of the crystal quartz element 1 can be improved.

When the pressing face 31 heats and presses the main face 10a, the temperature of the pressing jig 30 may be set to 200° C. or more and 573° C. or less, and the pressing jig 30 may be applied with a force equal to or greater than the 100 MPa toward the crystal quartz body 10. In this case, the ratio of the depth to the width of each polarity inverted region 11 can be increased. Thus, the light transmitted through the inside of the crystal quartz element 1 is well phase-matched in the plurality of polarity inverted regions 11.

The difference between the linear expansion coefficient of the pressing jig 30 and the linear expansion coefficient of the crystal quartz may be 113% or less. In this case, when the pressing face 31 heats and presses the main face 10a, damage to at least one of the crystal quartz body 10 and the pressing jig 30 may be prevented.

The hardness of the projection 32 may be equal to or greater than the hardness of crystal quartz. In this case, since the projection 32 is hardly worn by the crystal quartz body 10, the pressing jig 30 can be favorably reused.

Figure 5:
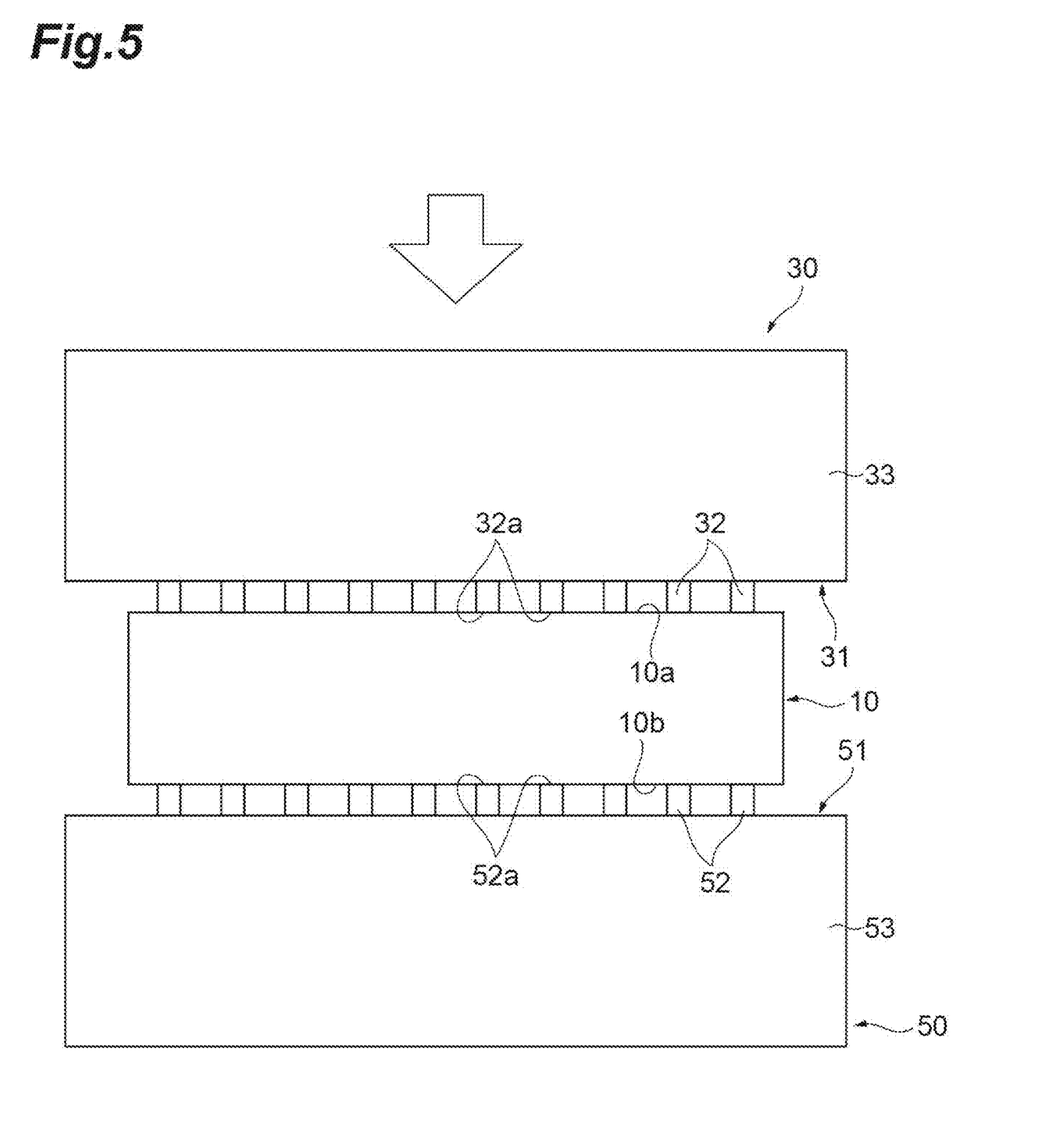
FIG. 5 is a diagram illustrating a method of manufacturing a crystal quartz element according to a modified example.

Hereinafter, a method of manufacturing a crystal quartz element according to a modified example of the above-described embodiment will be described with reference to FIG. 5. FIG. 5 is a diagram illustrating a method of manufacturing a crystal quartz element according to a modified example.

In this modified example, as shown in FIG. 5, the crystal quartz body 10 is placed on a pressing jig 50 (second pressing jig) instead of the stage 40. The pressing jig 50 is a member for pressing the crystal quartz body 10 with its pressing face 51 (second pressing face) in the same manner as the pressing jig 30. In the present embodiment, the pressing jigs 30, 50 have the same shape each other, but is not limited thereto. The preparation of the pressing jig 50 may be performed simultaneously with the preparation of the crystal quartz body 10 and the preparation of the pressing jig 30, or may be performed at a different timing.

Here, the configuration of the pressing jig 50 will be described. The pressing jig 50 has a body portion 53 including a pressing face 51 provided with a plurality of projections 52 (a plurality of second projection). For this reason, the pressing face 51 of the pressing jig 50 includes an uneven surface. Each of the plurality of projections 52 is a protrusion protruding from the main body portion 53, and has a substantially rectangular shape in plan view and side view. In the present modification, the plurality of projections 52 are periodically provided. The distal face 52a of each projection 52 is a plane face located on the same plane face in side view. The amount of protrusion of each projection 52 is, for example, equal to or greater than 0.1 µm and equal to or less than 100 µm. The width of each projection 52 corresponds to the width of each projection 32 included in the pressing jig 30. In addition, the interval between adjacent projections 52 coincides with the interval between adjacent projections 32 in the pressing jig 30. From the viewpoint of preventing the pressing jig 50 from being damaged, a hardness of the projection 52 is equal to or higher than the hardness of the crystal quartz.

Returning to FIG. 5, when the main face 10a of the crystal quartz body 10 is heated and pressed by the pressing face 31 of the pressing jig 30, the pressing face 51 of the pressing jig 50 heats and presses the main face 10b of the crystal quartz body 10 in a state in which the projection 32 and the projection 52 face each other via the crystal quartz body 10. As a result, both the main face 10a and the main face 10b located on the opposite side of the main face 10a are heated and pressed. The pressing jig 50 is heated in advance to, for example, 200° C. or higher and 573° C. or lower as in the pressing jig 30. Further, the difference be tween the linear thermal expansion coefficient of the pressing jig 50 and the linear thermal expansion coefficient of the crystal quartz is 113% or less. When the difference has a lower limit, the lower limit may be 0% or may be 27%. When the difference is 113% or less, mechanical damage to both the pressing jig 50 and the crystal quartz body 10 is suppressed at the time of applying stresses to the crystal quartz body 10. The pressing jig 50 is, for example, a metallic jig, a jig made of an alloy such as stainless steel, or a jig made of ceramics. When the linear thermal expansion coefficient of the pressing jig 50 is denoted by LEC3, the difference between the linear thermal expansion coefficient of the pressing jig 50 and the linear thermal expansion coefficient of the crystal quartz is represented by "(LEC3−LEC2)/LEC2."

When the crystal quartz body 10 is heated and pressed by the pressing jigs 30, 50, the projections 32 of the pressing jig 30 and the projections 52 of the pressing jig 50 overlap each other in the thickness-wise direction of the crystal quartz body 10. In the present modification, the projections 32, 52 completely overlap each other in plan view. In this case, the polarity inverted region formed from a side of the main face 10a and the polarity inverted region formed from a side of the main face 10b overlap well. As a result, the plurality of polarity inverted regions 11 are accurately provided from the main face 10a to the main face 10b in the direction D3. In addition, the shape of each polarity inverted region 11 is likely to be uniform. From the viewpoint of satisfactorily matching the projections 32, 52, both of the pressing jigs 30, 50 may be provided with a marker, a notch, or the like.

Also in the present modification described above, the same operation and effect as those of the above-described embodiment are exhibited. Moreover, in the present modification, the polarity inverted regions 11 are easily provided from the main face 10a to the main face 10b. That is, the ratio of the depth to the width of the polarity inverted region 11 can be increased. Thus, the light transmitted through the inside of the crystal quartz element 1 is well phase-matched by the plurality of polarity inverted regions 11.

The crystal quartz element and the method of manufacturing the same according to one aspect of the present disclosure are not limited to the above-described embodiment and the above-described modifications, and various modifications may be made. For example, although a plurality of polarity inverted regions are periodically provided in the above-described embodiment and the above-described modification, no limited thereto, and the polarity inverted regions may be provided at predetermined positions derived from the refractive index dispersion of the crystal quartz. Thus, the plurality of polarity inverted regions may be non-periodically provided in the crystal quartz body. In addition, the plurality of polarity inverted regions are not limited to the aspects described in the above-described embodiment and the above-described modification example. For example, the plurality of polarity inverted regions may be periodically provided not only along the direction D1 but also along the direction D2 in plan view. Alternatively, the plurality of polarity inverted regions may be periodically provided only along the direction D2 in plan view, or may be non-periodically provided in both the directions D1, D2. Also, the polarity non-inverted region may not be partitioned by the polarity inverted regions. In this case, the crystal quartz element includes a plurality of polarity inverted regions and a single polarity non-inverted region. The plurality of polarity inverted regions may not be provided in the entire main face in plan view. For example, the plurality of polarity inverted regions may be provided only in the central portion of the main face in plan view. The shape and position of the projection provided in each pressing jig change according to the form of the polarity inverted regions provided in the crystal quartz element. Therefore, the plurality of projections in each pressing jig may be provided aperiodically in plan view.

Figure 6:
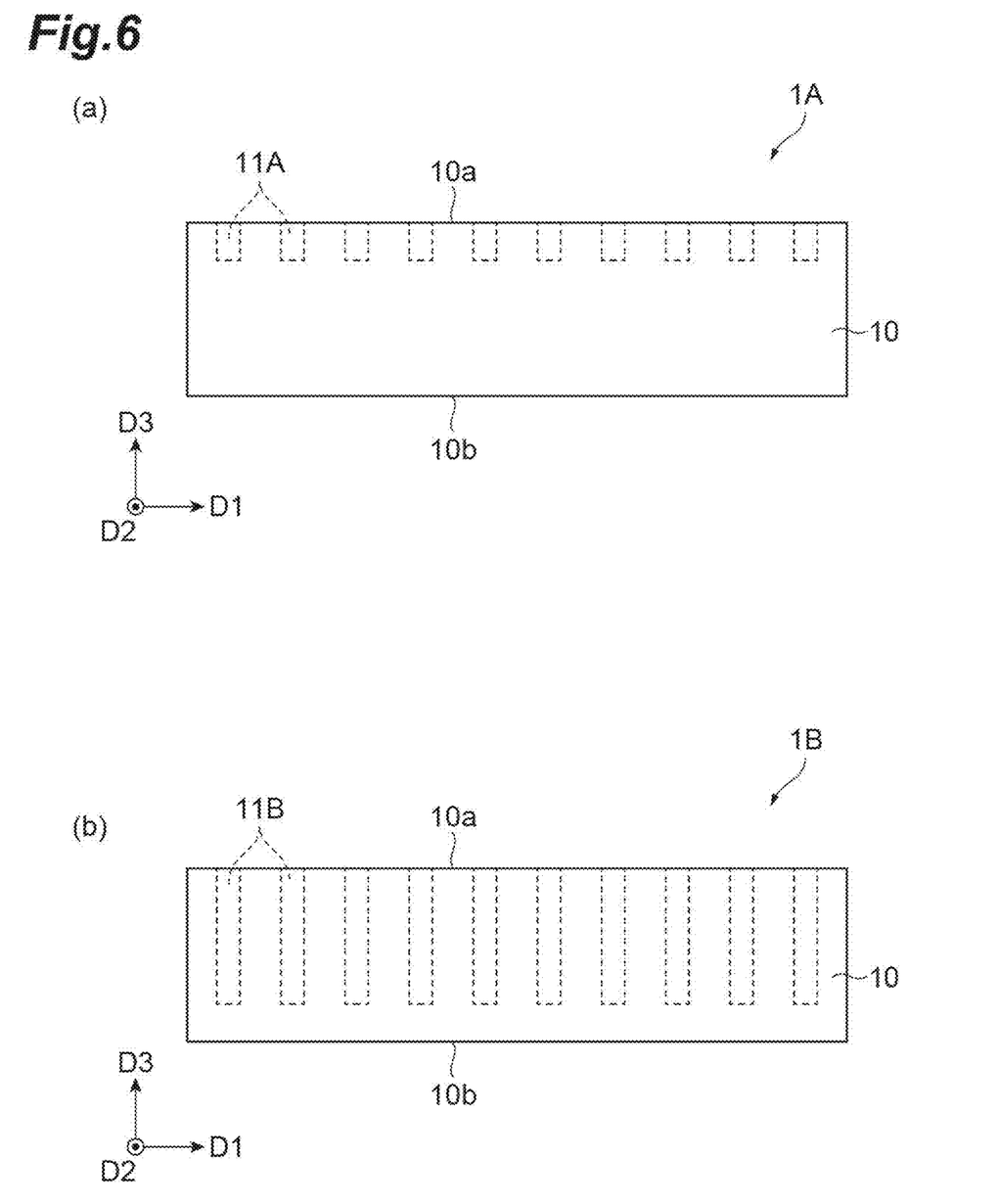

Although each polarity inverted region extends from one main face to the other main face in the crystal quartz body in the above embodiment and the above modification, no limited thereto. (a) and (b) of FIG. 6 are schematic side views showing another example of the crystal quartz element. In (a) of FIG. 6, a crystal quartz element 1A having a plurality of polarity inverted regions 11A is illustrated. Each of the plurality of polarity inverted regions 11A is provided only on a side of the main face 10a in the direction D3. The depth in each of the plurality of polarity inverted regions 11A along the direction D3 may be 5 μm or more. Even in this case, the crystal quartz element 1A can be favorably used as an optical waveguide, a wavelength-converting element, or the like. As a specific example, when the crystal quartz element 1A is used as the wavelength-converting element, the light transmitted through the inside of the crystal quartz element 1A (particularly, the main face 10a and the vicinity thereof) is well phase-matched in the plurality of polarity inverted region 11A. (b) of FIG. 6 illustrates a crystal quartz element 1B having a plurality of polarity inverted regions 11B. The depth in each of the plurality of polarity inverted regions 11B along the direction D3 is, for example, 100 μm or more. Again, the crystal quartz element 1B may be better utilized as an optical waveguide, wavelength-converting element, or the like. As an example, when a crystal quartz element 1B is used as the wavelength-converting element, light transmitted through the crystal quartz element 1B may be better phase-matched at the plurality of polarity inverted region 11B.

In the above-described embodiment and modified example, the main body of the pressing jig and the projections are integrally formed, but no limited thereto. For example, the projections may be a deposited work pieces that are deposited on a surface that serves as the pressing face of the body. In this case, the material constituting the projections may be the same as or different from the material constituting the main body. For example, when the main body is made of ceramics, the projections may be made of metal or an alloy. In any case, when the crystal quartz body is heated and pressed, the projection may have a performance of not deforming or substantially not deforming In the above-described embodiment and the above-described modification, when the pressing jig heats and presses the crystal quartz body, the pressing jig and the crystal quartz body are heated in advance, but no limited thereto. For example, only the pressing jig may be preheated. In this case, the pressing jig may be heated after the pressing jig is brought into contact with the crystal quartz body, or the pressing jig may be heated while the crystal quartz body is pressed by the pressing jig.

EXAMPLES

The present disclosure is illustrated in more detail by the following examples. The present disclosure is not limited to the following Examples.

In the present example, a stainless steel QPM stamp having a plurality of projections was prepared. The pitch of the plurality of projections was set to 124 μm. The pitch of the projections (i.e., 124 μm) corresponds to the QPM pitch when obtaining laser light of wavelengths 532 nm by second harmonic generation (SHG). In addition, a plate-shaped crystal quartz body having a main face as a plane face was prepared. The dimensions of the crystal quartz body in plan view were 10 mm×20 mm, and a thickness of the crystal quartz body was 1 mm.

Next, the main face of the crystal quartz body was heated and pressed by the projections of the QPM stamp such that the polarity of a portion of the crystal quartz body was inverted. In detail, pressure of 100 MPa or more at 300° C. or more was applied to the main face of the crystal quartz body from the QPM stamp for 100 seconds or more. Accordingly, a crystal quartz element having polarity inverted regions corresponding to the position of the projections were manufactured.

Figure 7:
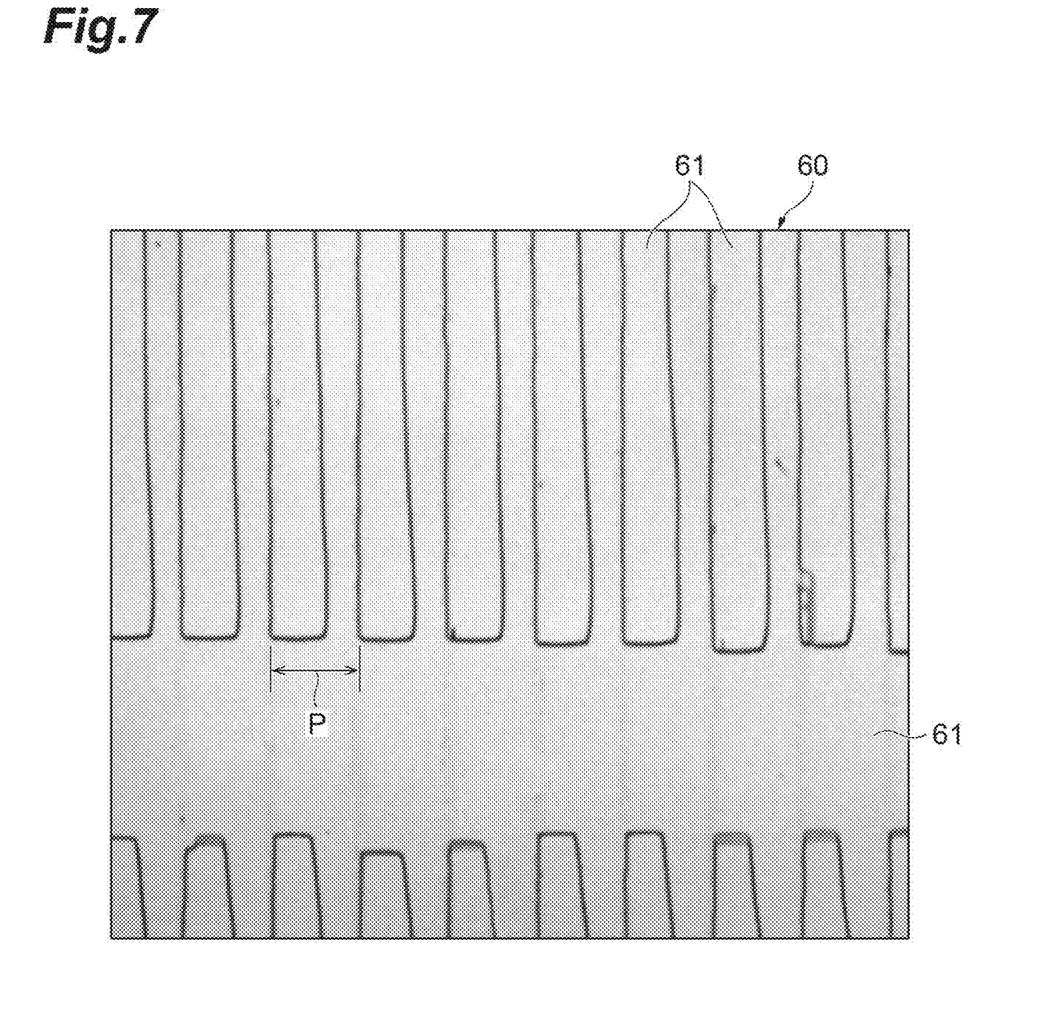
FIG. 7 is a view illustrating a surface after surface etching with respect to of crystal quartz element according to an example.

FIG. 7 is a view illustrating a surface after surface etching with respect to of crystal quartz element according to an example. In the crystal quartz element 60 shown in FIG. 7, a plurality of polarity inverted regions 61 periodically provided and a polarity non-inverted region 62 are shown. The QPM pitch P of the crystal quartz element 60 was 124 μm, which was substantially the same as the pitch of the projections included in the QPM stamp. From this result, it was confirmed that a substantially periodic polarity inverted regions are formed in the crystal quartz element in the example using the QPM stamp. In the surface etching process, only the polarity non-inverted region was removed by performing wet etching on the main face of the crystal quartz element. Hydrofluoric acid was used as an etchant.

Comparative Example

Unlike the above embodiment, a crystal quartz body in which polarity inversion was not performed was prepared. Therefore, in the comparative example, the crystal quartz body including only the polarity non-inverted region is used as the crystal quartz element.

(SHG Experiment)

The crystal quartz elements of Examples and Comparative Examples were irradiated with a pulsed laser having a wave length of 1064 nm (pulse width 0 to 0.7 ns). The excitation energy of the pulsed laser was increased stepwise from 0 mJ to 2.5 mJ. Then, the maximum value of the energy (second harmonic energy: SH energy) of the laser light of the wave length 532 nm transmitted through the crystal quartz element was detected.

Figure 8:
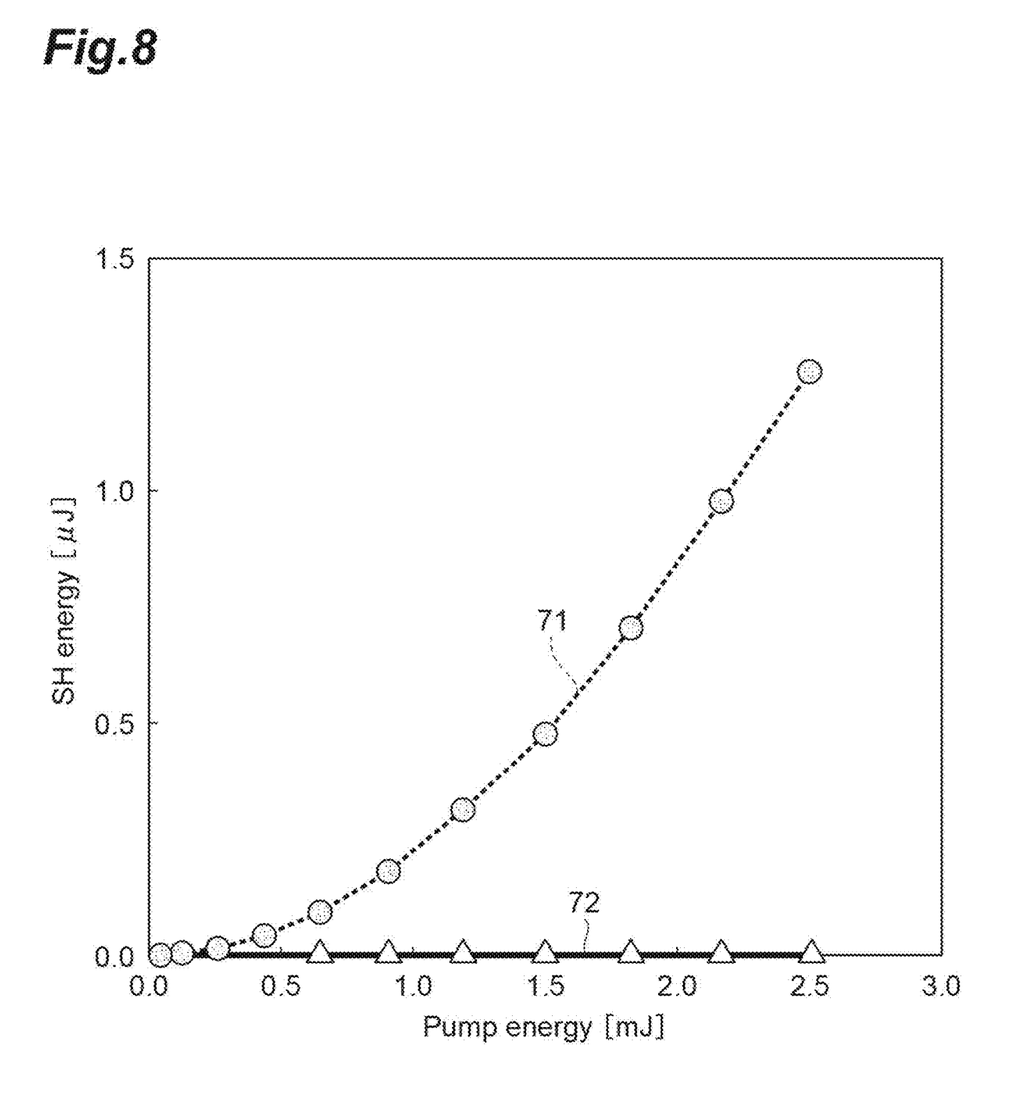
FIG. 8 shows detection results of the maximum value of SH energy in the example and the comparative example.

FIG. 8 shows detection results of a maximum value of the SH energy in the example and the comparative example. In FIG. 8, the vertical axis represents the maximum value of the SH energy, and the horizontal axis represents the excitation energy. A graph 71 indicates the maximum value of the SH energy in the example, and a graph 72 indicates the maximum value of the SH energy in the comparative example. As shown in FIG. 8, in the example, it was confirmed that the SH energy also increased with the increase of the excitation energy. In the example, the SH energy was 1.26 μJ when the excitation energy was 2.5 mJ. On the other hand, in the comparative example, it was confirmed that the SH energy was substantially constant even when the excitation energy increased. In the comparative example, when the excitation energy was 2.5 mJ, the SH energy was 6.19 nJ. That is, the excitation energy detected in the example was several hundred times higher than that in the comparative example. From these results, it was confirmed that the crystal quartz element according to the example can perform second harmonic generation (that is, has a QPM structure), unlike the comparative example.

REFERENCE SIGNS LIST

1, 1A, 1B, 60: crystal quartz element
2: pulsed light generating device (laser light generation device)
3: condenser lens
10: crystal quartz body
10*a*: main face (first main face)
10*b*: main face (second main face)
10*c* to 10*f*: side face
11, 11A, 11B, 61: polarity inverted region
12, 62: polarity non-inverted region
20: optical oscillation device
30: pressing jig (first pressing jig)
31: pressing face (first pressing face)
32: projection (second projection)
33: main body
50: pressing jig (second pressing jig)
51: pressing face (second pressing face)
52: projection (second projection).

The invention claimed is:

1. A crystal quartz element comprising a main face provided with a plurality of polarity inverted regions and a polarity non-inverted region,
   wherein the plurality of polarity inverted regions are spaced apart from each other via the polarity non-inverted region, and a whole of the main face is a flat face, and
   wherein all the plurality of polarity inverted regions are in contact with the main face and spaced apart from a back face.

2. The crystal quartz element according to claim 1,
   wherein a thickness of the crystal quartz element along a second direction crossing the main face is greater than or equal to 0.1 μm, and
   wherein a depth of each of the plurality of polarity inverted regions along the second direction is greater than or equal to 5 μm.

3. The crystal quartz element according to claim 2, wherein the depth of each of the plurality of polarity inverted regions along the second direction is greater than or equal to 100 μm.

4. The crystal quartz element according to claim 1, wherein the plurality of polarity inverted regions are arranged in a predetermined position derived from refractive index dispersion of a crystal quartz.

5. A light oscillation device comprising:
   the crystal quartz element according to claim 1; and
   a laser light generation device configured to emit laser light to the crystal quartz element,
   wherein an intensity of the laser light is higher than a damage threshold light intensity of a lithium niobate.

6. A method for manufacturing a crystal quartz element comprising:
- preparing a crystal quartz body including a first main face, a whole of which is a flat face, and a first pressing jig including a first pressing face on which a plurality of first projections are provided; and
- forming a plurality of polarity inverted regions corresponding to the plurality of first projections in the crystal quartz body by heating and pressing the first main face by the first pressing face,
- wherein a hardness of the first projections is equal to or greater than a hardness of a crystal quartz.

7. The method for manufacturing a crystal quartz element according to claim 6,
- wherein the crystal quartz body includes a second main face located opposite to the first main face,
- wherein, in the preparing the crystal quartz body and the first pressing jig, a second pressing jig including a second pressing face on which a plurality of second projections are provided is further prepared, and
- wherein, when the first pressing face heats and presses the first main face, the second projection face heats and presses the second main face in a state in which the first projections and the second projections faces with each other through the crystal quartz body.

8. The method for manufacturing a crystal quartz element according to claim 6,
- wherein, when the first pressing face heats and presses the first main face,
  - a temperature of the first pressing jig is set to 200° C. or more and 573° C. or less, and
  - a force equal to or greater than 100 MPa and directed toward the crystal quartz body is applied to the first pressing jig.

9. The method for manufacturing a crystal quartz element according to claim 6,
- wherein a difference between aa difference between a linear thermal expansion coefficient of the first pressing jig and a linear thermal expansion coefficient of the crystal quartz is 113% or less.

10. The method for manufacturing a crystal quartz element according to claim 6,
- wherein all the plurality of polarity inverted regions are in contact with the first main face and spaced apart from a second main face.

11. A method for manufacturing a crystal quartz element comprising:
- preparing a crystal quartz body including a first main face, a whole of which is a flat face and a second main face located opposite to the first main face, a first pressing jig including a first pressing face on which a plurality of first projections are provided, and a second pressing jig including a second pressing face which is a plane face; and
- forming a plurality of polarity inverted regions corresponding to the plurality of first projections in the crystal quartz body by heating and pressing the first main face by the first pressing face and the second main face by the second pressing face.

12. The method for manufacturing a crystal quartz element according to claim 11,
- wherein, when the first pressing face heats and presses the first main face,
  - a temperature of the first pressing jig is set to 200° C. or more and 573° C. or less, and
  - a force equal to or greater than 100 MPa and directed toward the crystal quartz body is applied to the first pressing jig.

13. The method for manufacturing a crystal quartz element according to claim 11,
- wherein a difference between a linear thermal expansion coefficient of the first pressing jig and a linear thermal expansion coefficient of the crystal quartz is 113% or less.

14. The method for manufacturing a crystal quartz element according to claim 11,
- wherein a hardness of the first projections is equal to or greater than a hardness of a crystal quartz.

15. The method for manufacturing a crystal quartz element according to claim 11,
- wherein all the plurality of polarity inverted regions are in contact with the first main face and spaced apart from the second main face.

* * * * *